United States Patent
Yamanaka (10) Patent No.: US 7,259,560 B2
(45) Date of Patent: Aug. 21, 2007

(54) MAGNETIC RESONANCE IMAGING APPARATUS AND METHOD

(75) Inventor: Masaaki Yamanaka, Otawara (JP)

(73) Assignees: Kabushiki Kaisha Toshiba, Tokyo (JP); Toshiba Medical Systems Corporation, Tochigi (JP)

( * ) Notice: Subject to any disclaimer, the term of this patent is extended or adjusted under 35 U.S.C. 154(b) by 43 days.

(21) Appl. No.: 11/016,996

(22) Filed: Dec. 21, 2004

(65) Prior Publication Data

US 2005/0134273 A1    Jun. 23, 2005

(30) Foreign Application Priority Data

Dec. 22, 2003    (JP)    ............................. 2003-424326

(51) Int. Cl.
*G01V 3/00*    (2006.01)
(52) U.S. Cl. ........................ 324/318; 324/307; 324/309
(58) Field of Classification Search ................ 324/307, 324/309, 318
See application file for complete search history.

(56) References Cited

U.S. PATENT DOCUMENTS

| 4,991,587 A | * | 2/1991 | Blakeley et al. | ............ 600/483 |
|---|---|---|---|---|
| 6,937,015 B2 | * | 8/2005 | Heid | .......................... 324/307 |
| 7,047,062 B2 | * | 5/2006 | Licato et al. | ................ 600/410 |
| 2003/0216633 A1 | * | 11/2003 | Licato et al. | ................ 600/410 |
| 2004/0263166 A1 | * | 12/2004 | Kluge | ......................... 324/309 |
| 2005/0068030 A1 | * | 3/2005 | Mansfield et al. | ........... 324/309 |

FOREIGN PATENT DOCUMENTS

| JP | 4-71535 | 3/1992 |
|---|---|---|
| JP | 5-42126 | 2/1993 |

* cited by examiner

*Primary Examiner*—Brij Shrivastav
*Assistant Examiner*—Dixomara Vargas
(74) *Attorney, Agent, or Firm*—Nixon & Vanderhye P.C.

(57) ABSTRACT

A method of controlling a magnetic resonance imaging apparatus is provided with generating a gradient magnetic field in a predetermined space, calculating a duration time period of a rate of a change of the gradient magnetic field, and determining whether the rate of the change of the gradient magnetic field is within a permitted time period.

27 Claims, 8 Drawing Sheets

MAGNETIC RESONANCE IMAGING APPARATUS AND METHOD

CROSS-REFERENCE TO RELATED APPLICATIONS

This application is based upon and claims the benefit of priority from prior Japanese Patent Application No. 2003-424326, filed Dec. 22, 2003, the entire contents of which are incorporated herein by reference.

BACKGROUND OF THE INVENTION

1. Field of the Invention

The present invention relate to a magnetic resonance imaging (MRI) apparatus for imaging a magnetic resonance signal generated from a subject, and particularly relates to a constitution thereof for preventing the nerve of a subject, caused by a change of an applied magnetic field over time, from being stimulated.

2. Description of the Related Art

A magnetic resonance imaging apparatus is an apparatus in which chemical and physical microscopic information of a substance is imaged, or a chemical shift spectrum thereof is observed by utilizing a phenomenon of resonantly absorbing an energy of a high frequency magnetic field rotated by a specific frequency when a group of nuclei having an inherent magnetic moment is placed in a uniform magnetostatic field.

In diagnosis using the magnetic resonance imaging apparatus, a gradient magnetic field for executing phase encoding and frequency encoding is swiftly applied and, thereafter, application/stop of a gradient magnetic field B are repeatedly executed at high speed in accordance with a predetermined sequence. During this sequence, an eddy current can be generated in the subject in proportion to a rate dB/dt of a change in a magnetic field over time which can stimulate the nerve of the subject.

In order to prevent the nerve from being stimulated in this way, according to the IEC (International Electrotechnical Commission), standard of the IEC requires that no problem is posed by the imaging sequence when it is confirmed that the nerve is not stimulated with regard to a specific number of persons by unspecified volunteers. Further the magnetic resonance imaging apparatus is controlled to constitute a sequence in conformity with the standard by checking a gradient magnetic field by software in the user interface.

However, a magnetic resonance imaging apparatus of a related art poses, for example, a problem described below. That is, even when the confirmation is carried out with regard to a specified number of persons in conformity with the IEC standard, it is not that no problem is always posed to all the subjects. Further, in related arts, there are technologies of determining an imaging position by changing the imaging position while observing a real image by using a real time locator as in JP-B-5-42126 and JP-A-4-71535. However, according to the technologies, even when all of the gradient magnetic fields B applied by softwares can be confirmed, a final output cannot be confirmed. Therefore, there is a case of bringing about omission of check. Meanwhile, when there is constituted a sequence which is safe for all the cases, there is a concern that the standard becomes severe more than necessary, which is not practical.

The present invention has been carried out in view of the above-described situation and it is an object thereof to provide a magnetic resonance imaging apparatus capable of realizing to apply a safe magnetic field at high speed and without omission of check. sum

BRIEF SUMMARY OF THE INVENTION

According to an aspect of the present invention, there is provided a magnetic resonance imaging apparatus comprising a gradient magnetic field generation unit configured to generate a gradient magnetic field in a predetermined space, a storage unit configured to store first information about a relationship between amounts of changes of the gradient magnetic field and rates of changes of the gradient magnetic field, and second information about a relationship between the rates of changes of the gradient magnetic field and permitted time periods, a control data generation unit configured to generate control data to control the gradient magnetic field, a first calculation unit configured to calculate rate of change of the gradient magnetic field based on the first information and amount of change of the gradient magnetic field to be applied in accordance with the control data, a second calculation unit configured to calculate a permitted time period of rate of change based on the second information and the calculated rate of the change of the gradient magnetic field and a third calculation unit configured to calculate a duration time period of the rate of the change of the gradient magnetic field based on the control data, and a determination unit configured to determine whether the calculated duration time period is within the permitted time period.

According to another aspect of the present invention, there is provided a magnetic resonance imaging apparatus comprising a gradient magnetic field generation unit configured to generate a gradient magnetic field in a predetermined space, means for obtaining a duration time period of a rate of a change of the gradient magnetic field, and means for determining whether the duration time period is within a permitted time period.

According to another aspect of the present invention, there is provided a method of controlling a magnetic resonance imaging apparatus comprising generating a gradient magnetic field in a predetermined space, obtaining a duration time period of a rate of a change of the gradient magnetic field time, and determining whether the duration time period is within a permitted time period.

DETAILED DESCRIPTION OF THE INVENTION

An explanation will be given of a first and a second embodiment in reference to the drawings as follows. Further, in the following explanation, constituent elements having substantially the same functions and constitutions are attached with the same notations and a duplicated explanation thereof will be given only when needed.

FIRST EMBODIMENT

An embodiment will be explained in reference to the drawings as follows. Further, in the following explanation, constituent elements having substantially the same functions and constitutions are attached with the same notations and a duplicated explanation will be given only when needed.

Figure 1:
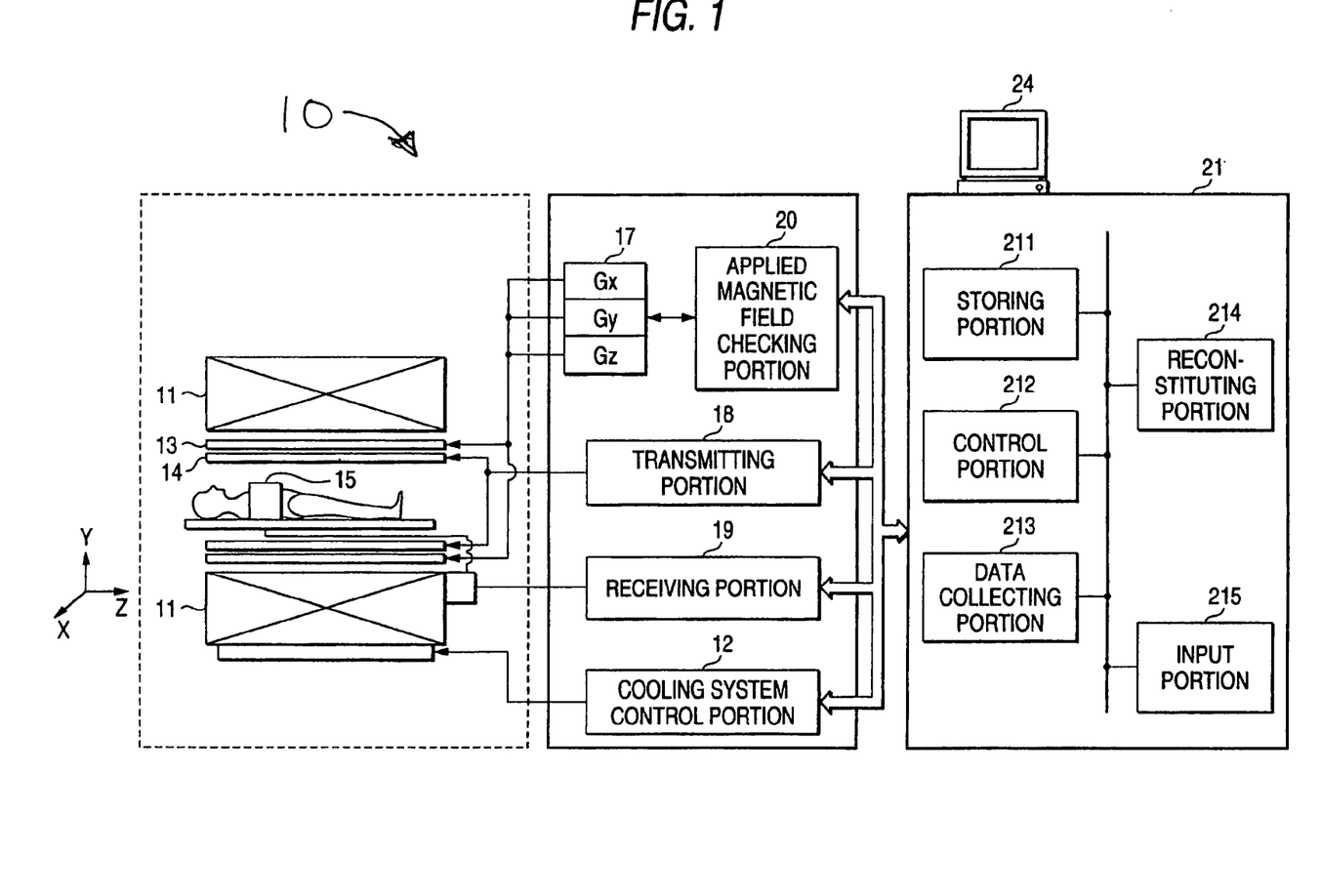
FIG. 1 shows a block diagram of a magnetic resonance imaging apparatus 10 according to an embodiment.

FIG. 1 shows a block diagram of a magnetic resonance imaging apparatus according to an embodiment. First, a constitution of the magnetic resonance imaging apparatus will be explained in reference to FIG. 1.

The magnetic resonance imaging apparatus 10 is provided with a magnetostatic field magnet 11, a cooling system control portion 12, a gradient magnetic field coil 13, a high frequency (RF) coil 14 for the whole body, a high frequency receiving coil 15, a gradient magnetic field coil driving apparatus 17, a transmitting portion 18, a receiving portion 19, an applied magnetic field checking portion 20, an operating apparatus 21, and a display portion 24.

The magnetostatic field magnet 11 is a magnet for generating a magnetostatic field and generates a uniform magnetostatic field. For example, a permanent magnet, a superconductive magnet or the like is used for the magnetostatic field magnet 11 which is cooled by a cooling system.

The cooling system control portion 12 controls the cooling system for cooling the magnetostatic field magnet 11.

The gradient magnetic field coil 13 is a magnetic field coil an axis of which is shorter than that of the magnetostatic field magnet 11, and is provided on an inner side of the magnetostatic field magnet 11. The gradient magnetic field coil 13 forms a gradient magnetic field having linear gradient magnetic field distributions in three directions of X, Y, Z orthogonal to each other based on a pulse current supplied from the gradient magnetic field coil driving apparatus 17. By the gradient magnetic field generated by the gradient magnetic field coil 13, a signal generating portion (position) is specified.

Further, the Z axis direction is set to a direction the same as the direction of the magnetostatic field (body axis direction of a subject) according to the embodiment. Further, according to the embodiment, the gradient magnetic field coil 13 and the magnetostatic field magnet 11 are constituted by a cylindrical shape. Further, the gradient magnetic field coil 13 may be arranged in a vacuum by a predetermined supporting mechanism. This is desirable in view of quiet sound formation, in that vibration of the gradient magnetic field coil 13, generated by applying a pulse current, is prevented from being propagated to the outside as a sound wave.

The RF coil 14 for the whole body is a coil applied with a high frequency pulse for generating a magnetic resonance signal to a region for imaging the subject. Further, the RF coil 14 for the whole body is used also as a receiving coil when, for example, the abdomen portion or the like is imaged.

The high frequency receiving coil (RF receiving coil) 15 is a movable surface coil having, for example, a shape exclusive for the body portion.

The gradient magnetic field coil driving apparatus 17 generates a pulse signal applied to the gradient magnetic field coil 13 based on control from the operating apparatus 21.

The transmitting portion 18 includes an oscillating portion, a phase selecting portion, a frequency converting portion, an amplitude modulating portion, and a high frequency power amplifying portion for transmitting a high frequency pulse in correspondence with Larmor frequency to the RF coil 14 for the whole body. By a high frequency generated from the RF coil 14 for the whole body by the transmission, magnetization of an atomic nucleus of the subject is brought into an excited state.

The receiving portion 19 includes an amplifying portion, an intermediate frequency converting portion, a phase sensitive detector portion, a filter, and an A/D converter for processing respective magnetic resonance signals (high frequency signal) received from respective receivers individually to predetermined signal processings. That is, the receiving portion 19 subjects a magnetic resonance signal, emitted when magnetization of a nucleus is alleviated from the excited state to a ground state, to an amplifying processing, an intermediate frequency converting processing utilizing a transmitting frequency, a phase sensitive detector processing, a filter processing and an A/D conversion processing.

The applied magnetic field checking portion 20 determines whether dB/dt of a gradient magnetic field applied by a pulse signal in accordance with a predetermined sequence satisfies a predetermined standard. Further, the applied magnetic field checking portion 20 cuts the pulse signal applied to the gradient magnetic field coil 13 when it is determined that dB/dt of the gradient magnetic field does not satisfy the predetermined standard. A detailed explanation will be given later of an inner constitution of the applied magnetic field checking portion 20 and an applied magnetic field checking function realized by the applied magnetic field checking portion 20.

The operating apparatus 21 is provided with a storing portion 211, a control portion 212, a data collecting portion 213, a reconstituting portion 214, and an input portion 215.

The storing portion 211 stores magnetic resonance signal data before reconstitution provided via the receiving portion 19, magnetic resonance image data after reconstitution provided via the operating apparatus 21 and the like for respective patients.

The control portion 212 includes a CPU, a memory and the like and statically or dynamically controls the magnetic resonance imaging apparatus 10 as a control center of the total system. Particularly, the control portion 212 executes a control to receive and process magnetic resonance signals in parallel by a plurality of RF receiving coils having different sensitivity distributions when parallel imaging is executed. Further, the control portion 212 generates various data of control data (which determine intensities of gradient magnetic fields generated in respective directions of coordinate axes and a sequence) in a processing realized by the applied magnetic field checking function, mentioned later.

The data collecting portion 212 collects a digital signal sampled by the receiving portion 19.

The reconstituting portion 214 executes a post processing, that is, reconstitution of Fourier transformation or the like for the digital signal collected by the date collecting portion 212 and calculates data of spectrum of desired nuclear spin in the subject or image data. Further, the reconstituting portion 214 generates an MR image with regard to the body portion to be diagnosed based on the magnetic resonance signal collected by the high frequency receiving coil 15. Further, also an image can be generated by parallel imaging thereby. Further, parallel imaging is a technology of shorting imaging time by executing a sequence thinning phase encoding by using a plurality of RF receiving coils having different sensitivity distributions and executing a developing processing for removing a folded artifact by matrix operation. When the parallel imaging is executed, an image is reconstituted respectively from magnetic resonance signals from respective coils, thereafter, the developing processing is executed as post processing of a plurality of sheets of the provided images by using the sensitivity distributions of the respective coils to generate one sheet of an image.

The input portion 217 includes an input apparatus (mouse, track ball, mode switching switch, keyboard or the like) for inputting various designations, instructions and information from an operator.

The display portion 24 is an output apparatus for displaying spectrum data or image date inputted from the operating apparatus 21. Further, the display portion 24 displays a result provided by the applied magnetic field checking function, mentioned later, as necessary.

(Applied Magnetic Field Checking Function)

Figure 2:
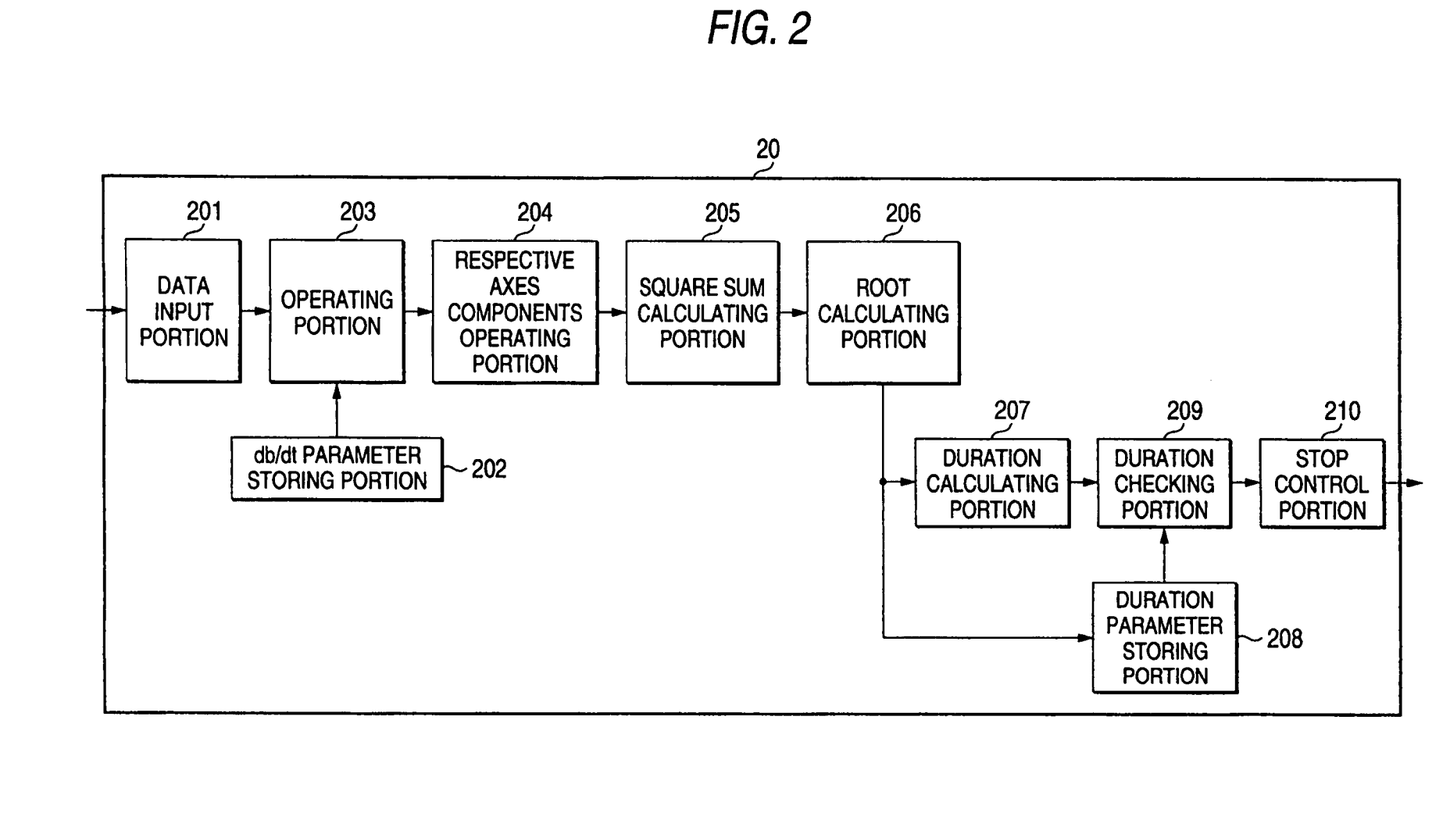
FIG. 2 is a diagram showing a constitution of an applied magnetic field checking portion 20.

An explanation will be given of a constitution of the applied magnetic field checking portion 20 provided by the magnetic resonance imaging apparatus 10, and the applied magnetic field checking function realized by the applied magnetic field checking portion 20 as follows. FIG. 2 is a diagram showing a constitution of the applied magnetic field checking portion 20 shown in FIG. 1. As shown by the drawing, the applied magnetic field checking portion 20 is provided with a data input portion 201, a db/dt parameter storing portion 202, an operating portion 203, a component calculating portion 204, a square sum calculating portion 205, a root calculating portion 206, a duration calculating portion 207, a duration parameter storing portion 208, a duration checking portion 209, and a stop control portion 210.

The data input portion 201 inputs control data for applying gradient magnetic fields in respective directions of coordinate axes, data with regard to generating the pulse signal and the like with regard to a predetermined position or a plurality of predetermined positions in a magnetostatic field formed by the magnetostatic field magnet 11 (that is, at least one point in the magnetostatic field) from the operating apparatus 21.

The db/dt parameter storing portion 202 stores a table corresponding data of amounts of changes in the gradient magnetic fields with regard to respective coordinate axes and values of db/dt predicted to generate in respective axis directions by the changes in the gradient magnetic fields. That is, the table is stored with parameters for corresponding the following 9 kinds of relationships.

A relationship between data of an amount of a change in the gradient magnetic field with regard to X axis and a value of db/dt produced in X axis direction A relationship between data of an amount of a change in the gradient magnetic field with regard to X axis and a value of db/dt produced in Y axis direction A relationship between data of an amount of a change in the gradient magnetic field with regard to X axis and a value of db/dt produced in Z axis direction A relationship between data of an amount of a change in the gradient magnetic field with regard to Y axis and a value of db/dt produced in X axis direction A relationship between data of an amount of a change in the gradient magnetic field with regard to Y axis and a value of db/dt produced in Y axis direction A relationship between data of an amount of a change in the gradient magnetic field with regard to Y axis and a value of db/dt produced in Z axis direction A relationship between data of an amount of a change in the gradient magnetic field with regard to Z axis and a value of db/dt produced in X axis direction A relationship between data of an amount of a change in the gradient magnetic field with regard to Z axis and a value of db/dt produced in Y axis direction A relationship between data of an amount of a change in the gradient magnetic field with regard to Z axis and a value of db/dt produced in Z axis direction The operating portion 203 calculates respective values of db/dt predicted to generate in respective axes of coordinates based on control data for generating the gradient magnetic fields with regard to a predetermined position or a plurality of predetermined positions in the magnetostatic field and the table stored in the db/dt parameter storing portion 202.

Further, according to the embodiment, in order to specify the explanation, the operating portion 203 calculates values of db/dt predicted to generate in respective directions of coordinate axes at an isocenter (isocenter determined by centers of gradient magnetic fields in three directions of X axis, Y axis, Z axis). Normally the isocenter coincides with a center of the magnetostatic field as the predetermined position in the magnetostatic field.

Figure 3A:
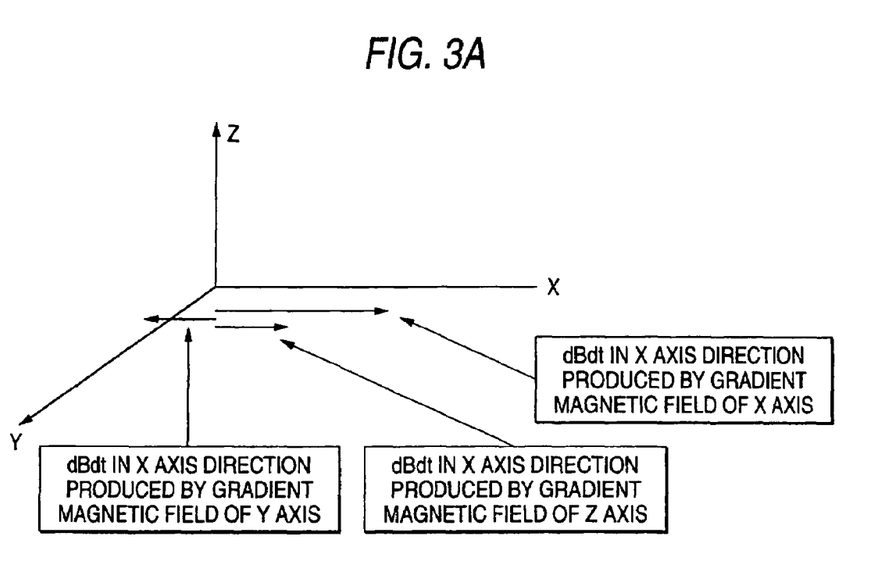
FIGS. 3A and 3B are views for explaining a method of calculating a value of db/dt generated in respective directions of coordinate axes.
Figure 3B:
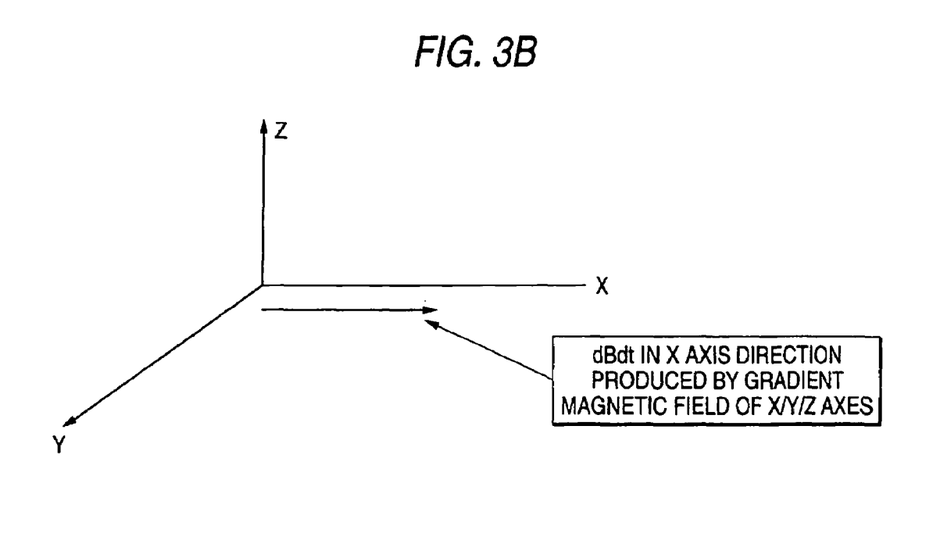

The component calculating portion 204 calculates values of db/dt predicted to generate in respective directions of coordinate axes at the isocenter by adding db/dt's provided by the operating portion 203 for respective coordinate axes. In the calculation, as shown by FIG. 3A, addition is executed after attaching polarities since there are db/dt's produced in respective axes (FIG. 3A and FIG. 3B show an example of X axis) which are canceled by each other. As a result, as shown by FIG. 3B, values of db/dt in respective axes directions formed by the gradient magnetic fields of respective axes are obtained.

Figure 4:
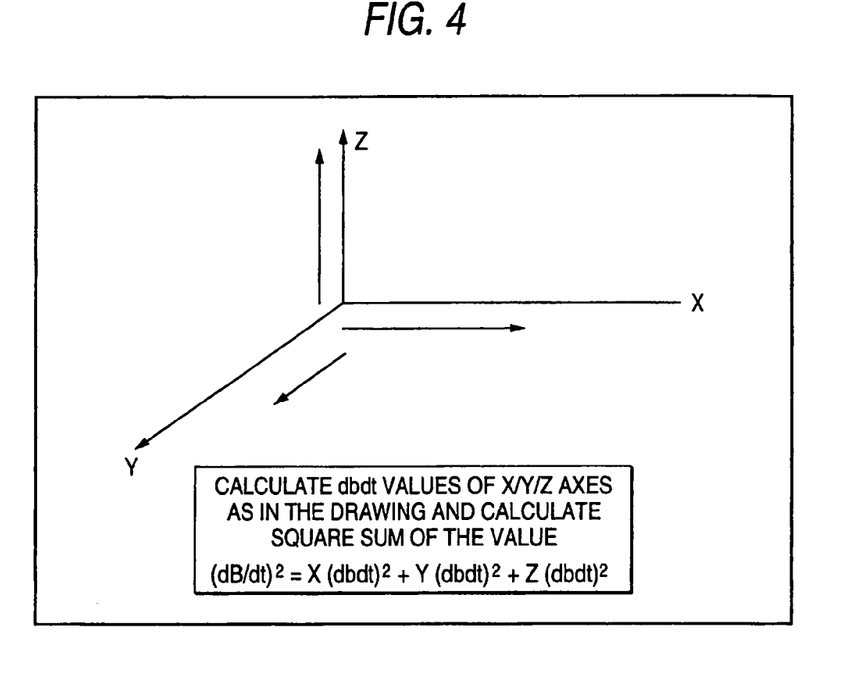
FIG. 4 is a view for explaining a method of calculating a square sum of values of db/dt with regard to the respective directions of coordinate axes.

The square sum calculating portion 205 calculates a value of a square sum $(dB/dt)^2$ of values of db/dt in respective directions of coordinate axes as shown by FIG. 4 based on Equation (1) shown below.

$$(dB/dt)^2 = x(db/dt)^2 + y(db/dt)^2 + z(db/dt)^2 \quad (1)$$

Figure 5:
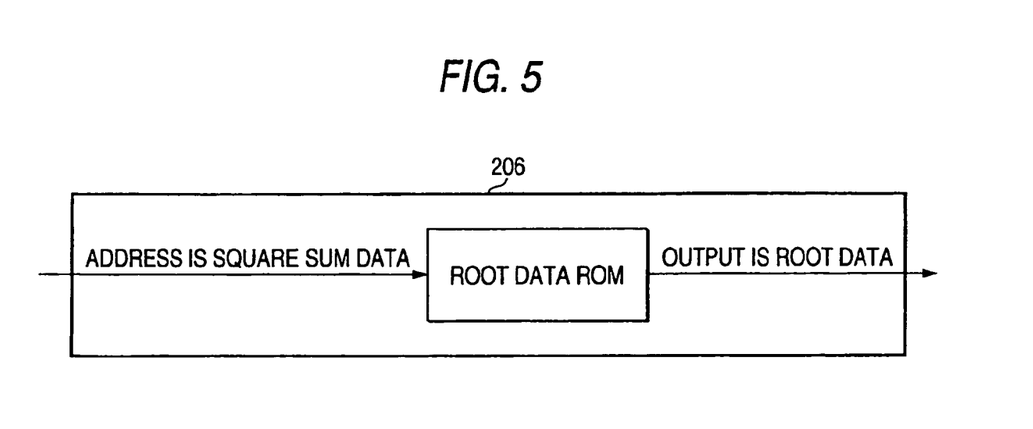
FIG. 5 is a view for explaining a function of a root calculating portion 206.

The root calculating portion 206 calculates the value of dB/dt with regard to the isocenter by calculating root of the value of $(dB/dt)^2$ provided by the square sum calculating portion 205. Further, in calculating by the root calculating portion 206, there is provided a storing portion of ROM or the like for storing values of roots and when data of the value $(dB/dt)^2$ of the square sum is provided to an address of the storing portion, as shown by FIG. 5, data of root is outputted as data. Therefore, calculation of the root can be finished only by time of memory access.

The duration calculating portion 207 calculates a duration of generating the gradient magnetic field based on control data with regard to generating the gradient magnetic field inputted from the operating apparatus 21. Calculation of duration of generating the gradient magnetic field is executed by, for example, the following standard.

Generally, dB/dt is generated only when data of the gradient magnetic field is changed and therefore, when data of the gradient magnetic field is not changed, dB/dt is not generated. However, in actual imaging, even when a magnetic field is applied again after stopping for about 10 μS, it is difficult to conceive that dB/dt influencing on the subject becomes discontinuous.

Hence, the duration calculating portion 207 is previously provided with a certain set value (threshold) and calculates the duration of generating the gradient magnetic field by regarding that the magnetic field is continuously applied when the set value is not exceeded and regarding that the magnetic field is stopped to apply when the set value is exceeded on the other hand. The IEC standard does not clearly designate a stop time period for regarding dB/dt as discontinuous in this way. Further, with regard to the set value constituting the standard, the set value can be changed to an arbitrary value by setting a software.

Figure 6:
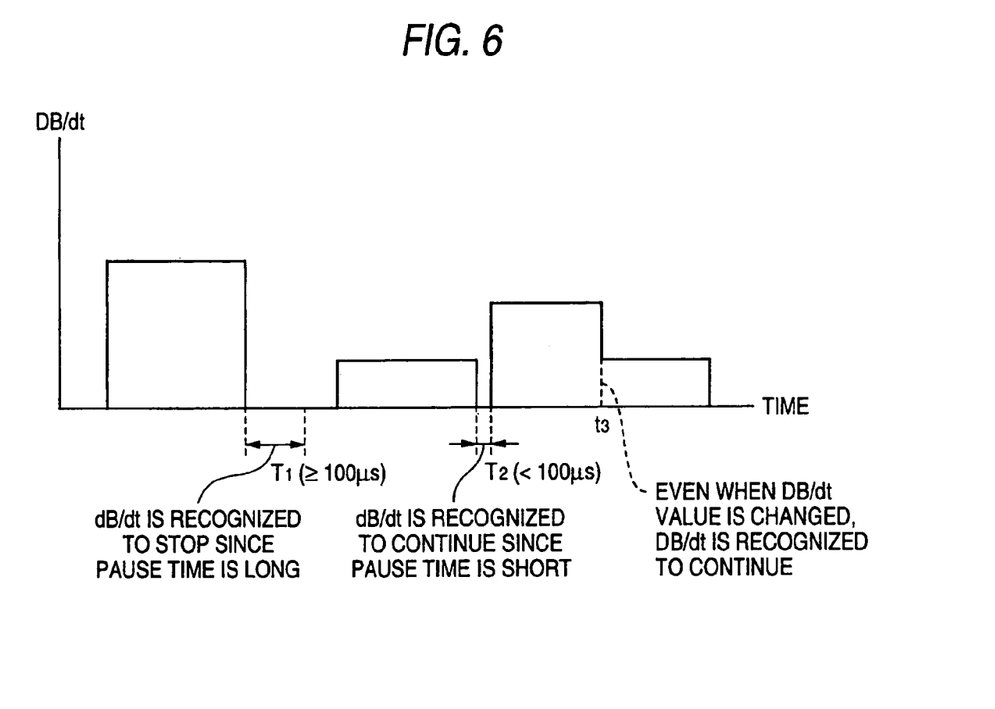
FIG. 6 is a view showing a change in the value of db/dt over time brought about by applying a gradient magnetic field.

FIG. 6 is a diagram showing a sequence of dB/dt for explaining a standard of calculating a duration for generating the gradient magnetic field. For example, according to an embodiment, an initial set value for calculating the duration of dB/dt is set to 100 μS and during a pause time period in which the value is not exceeded, dB/dt is regarded to continue. In such a case, with regard to a stop time period T1, the time period T1 is longer than 100 μS and therefore, the duration calculating portion 207 calculates the duration of generating dB/dt by regarding that dB/dt is stopped. Meanwhile, with regard to a stop time period, T2, the stop time period T2 is shorter than 100 μS and therefore, the duration calculating portion 207 calculates the duration of generating dB/dt by regarding that dB/dt continues.

Further, the duration calculating portion 207 determines such that the duration is recognized to be single even when the magnitude of the value of dB/dt is changed as shown by time t3 in FIG. 6. Further, when the magnitude of the value of dB/dt is changed in a single duration, a maximum value of dB/dt in the duration is searched and it is determined that the value of dB/dt continues. By constructing such a constitution, in a single duration in which the magnitude of value of dB/dt is changed, safety of the magnetic field is checked based on the maximum value of dB/dt in the duration and therefore, safer imaging can be realized.

Figure 7:
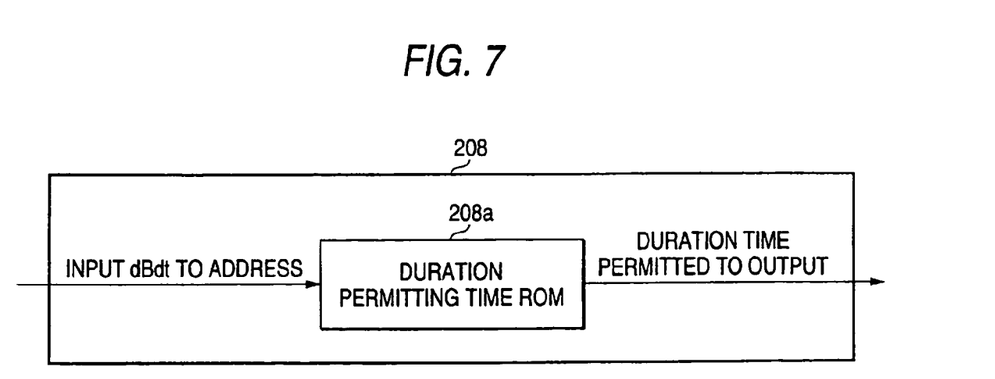
FIG. 7 is a view for explaining a function of a duration parameter storing portion 208.
Figure 8:
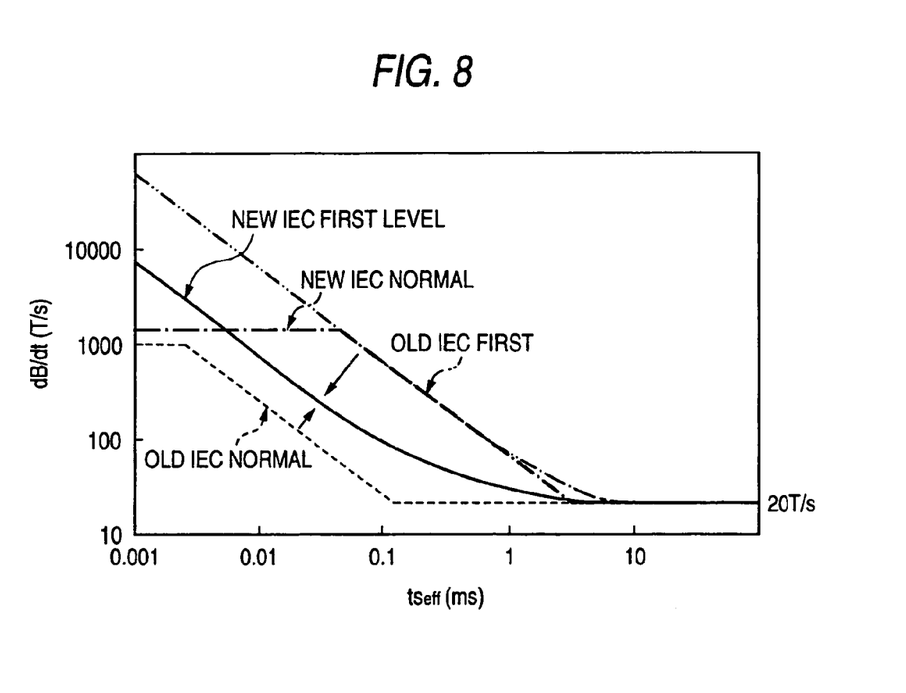
FIG. 8 is a view showing a new IEC normal standard and a new IEC first level stored to the duration parameter storing portion 208.

As shown by FIG. 7, the duration parameter storing portion 208 is stored with a duration permitting time ROM for storing information with regard to a duration permitting time period for applying dB/dt in accordance with a predetermined standard. According to the information, as information with regard to the duration permitting time period of applying dB/dt, there is stored a new IEC normal standard and a new IEC first level showing the duration permitting time period of dB/dt as shown by FIG. 8. Further, FIG. 7 simultaneously shows an old IEC normal standard and an old IEC first level for reference.

Inside of the duration permitting time ROM 208a is grossly divided into two regions. One is a duration region in accordance with the new IEC normal standard and other is a duration region in accordance with the new IEC first level. Switching of a region used, that is, switching between the new IEC normal standard and the new IEC first level can be carried out by setting an uppermost bit of an address in the duration parameter storing portion 208 to 0 or 1. As shown by FIG. 7, when the value of dB/dt is inputted to the duration permitting time ROM 208a as the address, duration permitting time period is outputted as data.

Figure 9:
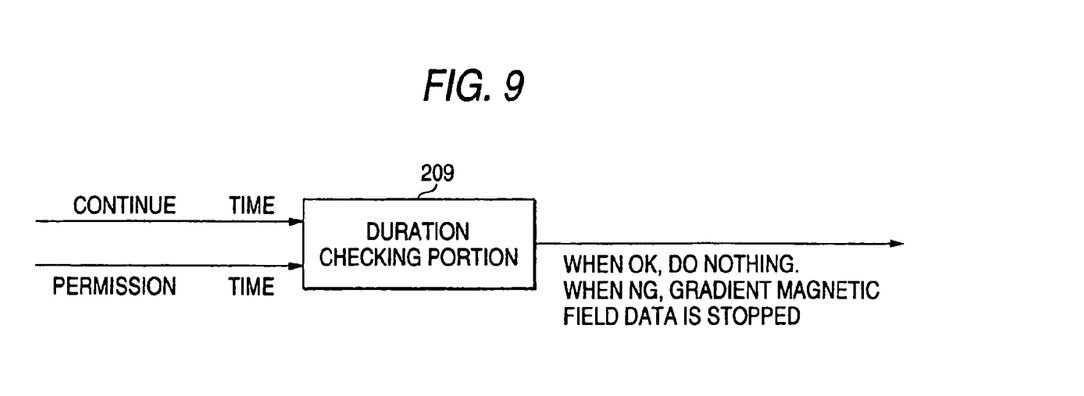
FIG. 9 is a view for explaining a function of a duration checking portion 209.

As shown by FIG. 9, the duration time checking portion 209 compares a duration calculated by the duration calculating portion 207 and the duration permitting time period acquired from the duration parameter storing portion 208 to check whether the duration exceeds the duration permitting time period.

The stop control portion 210 stops supplying data for generating the gradient magnetic field to the gradient magnetic field coil driving apparatus 17 when it is determined that the duration exceeds the duration permitting time period in the duration checking portion 209. In stopping to supply data, when the gradient magnetic field which is being applied is abruptly nullified, a large amount of dB/dt is generated. Therefore, the stop control portion 210 stops the gradient magnetic field by slowly reducing the gradient magnetic field from a value currently applied.

Figure 10:
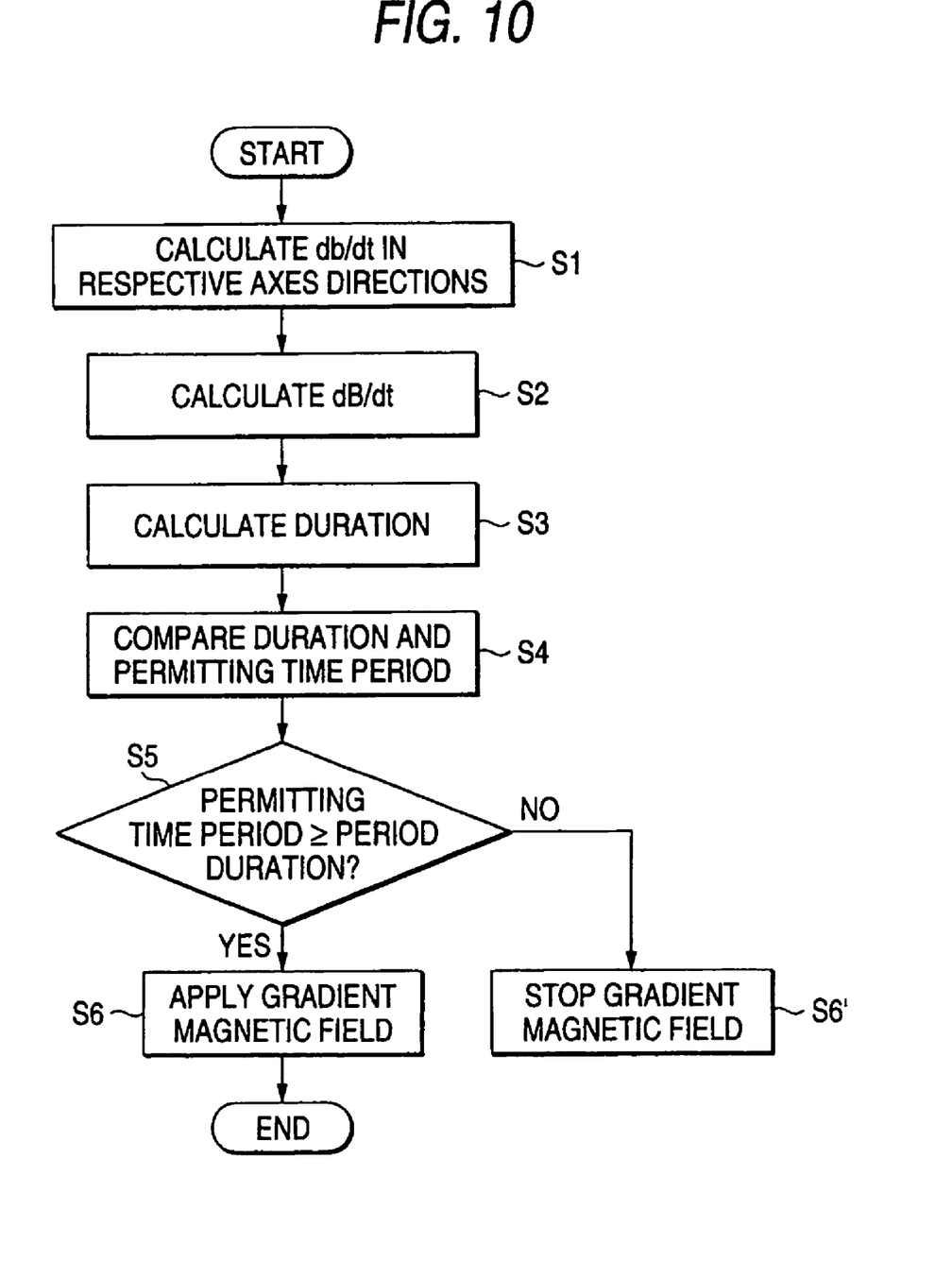
FIG. 10 is a flowchart showing a flow of processings executed in an applied magnetic field checking function.

Next, an explanation will be given of the applied magnetic field checking function realized by the applied magnetic field checking portion 20. FIG. 10 is a flowchart showing a flow of processings executed in the applied magnetic field checking function.

As shown by FIG. 10, the operation portion 203 calculates values of respective components of db/dt predicted to generate in respective coordinate axes by gradient magnetic fields applied in respective directions of coordinate axes based on control data for generating gradient magnetic fields inputted from the operating apparatus 21 and the table stored in the dB/dt parameter storing portion 202 and the component calculating portion 204 calculates values of respective components of db/dt with regard to respective directions of coordinate axes by adding the provided respective components of db/dt of respective coordinate axes by attaching polarities thereto (step S1).

Next, the square sum calculating portion 205 calculates a value of a square sum $(dB/dt)^2$ of values of db/dt in respective directions of coordinate axes and the root calculating portion 206 calculates data of root of dB/dt by providing the provided value of $(dB/dt)^2$ to the address (step S2).

Next, the duration calculating portion 207 calculates the duration of dB/dt by determining the duration by constituting a standard of the initial set value as 100 μS (step S3).

Next, the duration time checking portion 209 compares the provided duration of dB/dt and the permitting (duration) time period for respective values of dB/dt stored to the duration parameter storing portion 208 (step S4) and determines whether the duration falls in a range of permitting time period (step S5).

When it is determined that the duration falls in the range of the permitting time period at step S5, application of the gradient magnetic field is executed and continued based on the control data determined by the operating apparatus 21 by the gradient magnetic field coil driving apparatus 17 (step S6). On the other hand, when it is determined that the duration is out of the range of the permitting time period at step S5, the stop control portion 210 stops supplying the control data to the gradient magnetic field coil driving apparatus 17 and stops the gradient-magnetic field by slowly reducing the value of the gradient magnetic field currently applied (step S6').

The above-described processings of step S1 through step S6' can realize the applied magnetic field checking function by successively repeating the processings in applying the gradient magnetic field.

According to the above-described constitution, the following effect can be achieved.

First, according to the magnetic resonance imaging apparatus 10, a final output immediately before being supplied to the gradient magnetic field coil driving apparatus is individually and specifically checked in real time. Therefore, checking of whether the gradient magnetic field is applied in conformity with the standard can be executed for individual subjects precisely without omission and safe and agreeable image diagnosis can be realized.

Further, according to the magnetic resonance imaging apparatus 10, checking of the applied magnetic field is realized by a hardware constitution. Therefore, it can easily be checked how far is an applicable range of dB/dt duration and the function as a product can be ensured.

Further, by the above-described hardware constitution, checking of the applied magnetic field faster than that of the related art can be realized. According to an experiment of the inventors, the processings with regard to checking the applied magnetic field can be finished in 8 μS at a maximum. However, inside thereof is processed in pipeline and therefore, an interval of 4 μS is possible as the interval of inputting the gradient magnetic field data. Since the interval of transmitting the gradient magnetic field data of an MRI system is 4 μS all the data can be checked without omission in real time. In contrast thereto, in checking by a software of the related art, checking is carried out after determining a condition of the sequence and therefore, when time is taken in checking, scanning is retarded to start.

Further, owing to checking at a final stage and data is not changed thereafter and therefore, checked data and data used for applying the gradient magnetic field actually do not differ from each other and safe image diagnosis can firmly be realized. In contrast thereto, in checking by the software of the related art, by passing CPU of a real time control system even after checking or the like, also data is replaced by Hex data from a floating point and the data is difficult to be regarded as data per se checked by the software.

Further, as an imaging method, there is a method of imaging while changing the body portion to be imaged by observing a taken image as in a 3D locator disclosed in, for example, Japanese Patent Publication No. 3128228. Checking by the software cannot follow the body portion to be imaged which is being changed. In hardware, dB/dt is checked with regard to changed data and therefore, there is not omission also at the portion.

SECOND EMBODIMENT

Next, an explanation will be given of a second embodiment. According to the embodiment, dB/dt with regard to a plurality of predetermined positions in a magnetostatic field formed by the magnetostatic field magnet 11 is calculated and the applied magnetic field is checked based thereon.

Figure 11:
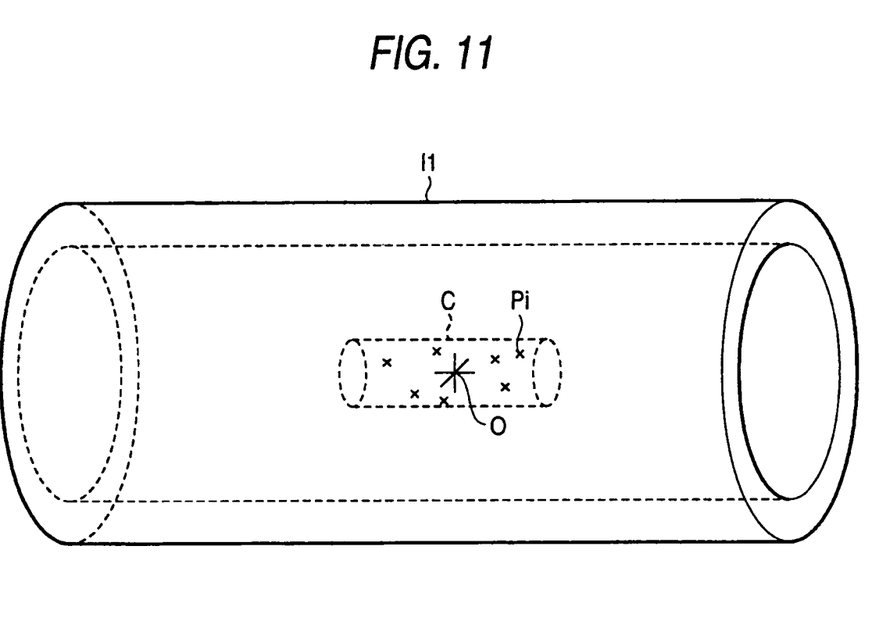
FIG. 11 is a view for explaining an applied magnetic field checking function executed by a magnetic resonance imaging apparatus according to an embodiment.

FIG. 11 is a view for explaining an applied magnetic field checking function executed by a magnetic resonance imaging apparatus according to the embodiment. As shown by the drawing, the data input portion 201 inputs control data from the operating apparatus 21 at a plurality of positions Pi ($1 \leq i \leq n$, incidentally, n is an integer equal to or larger than 2) arranged at random at a side face of a cylindrical region C (for example, a radius of 20 cm) having an axis in parallel with the axis of the magnetostatic field magnet 11 and including an isocenter O at inside thereof, for example, as an object of calculating dB/dt. Further, a region at which the plurality of positions Pi are present is not particularly limited. Although according to the embodiment, a cylindrical region approximating a shape of the human body is adopted, the embodiment is not restricted thereby. Further, a number of the plurality of positions Pi (that is, value of n) is not particularly limited. For example, there may be constructed a constitution of setting a number of the plurality of the Pi to cover up a total of the side face of the cylindrical region C.

Next, an explanation will be given of operation of a case of calculating dB/dt with regard to the plurality of positions Pi and checking an applied magnetic field based thereon in reference to FIG. 2.

The operating portion 203 calculates respective values of db/dt predicted to generate at respective coordinate axes at the plurality of positions Pi based on the control data for generating the gradient magnetic field and the table stored to the db/dt parameter storing portion 202.

The component calculating portion 204 adds db/dt provided at the operating portion 203 for respective coordinate axes and calculates values of db/dt predicted to generate in respective directions of coordinate axes at the plurality of positions Pi.

The square sum calculating portion 205 calculates values of square sums of $(dB/dt)^2$ of values of db/dt in respective directions of coordinate axes at the plurality of positions Pi based on Equation (1).

$$(dB/dt)^2 = x(db/dt)^2 + y(db/dt)^2 + z(db/dt)^2 \quad (1)$$

The root calculating portion 206 calculates values of dB/dt at the plurality of positions Pi by calculating roots of dB/dt of values of $(dB/dt)^2$ provided by the square sum calculating portion 205. Further, the root calculating portion 206 selects dB/dt having a maximum value in dB/dt's at the plurality of positions Pi provided by calculation to output to the duration calculating portion 207 and the duration parameter storing portion 208. dB/dt having the maximum value is selected from dB/dt's at the plurality of positions Pi in this way because when the applied magnetic field is checked at a position Pi in correspondence with dB/dt having the maximum value, at other position, the value is dB/dt which is smaller than the maximum value and therefore, the safety standard can firmly be guaranteed. However, the embodiment is not restricted thereby but there may be constructed a constitution of, for example, using means of dB/dt's at the plurality of positions Pi.

The duration calculating portion 207 calculates a duration of generating the gradient magnetic field based on the control data with regard to generating the gradient magnetic field inputted from the operating apparatus 21. Further, the duration parameter storing portion 208 outputs a duration permitting time period permitted by the inputted maximum value of dB/dt.

The duration checking portion 209 compares a duration calculated by the duration calculating portion 207 and a duration permitting time period acquired from the duration parameter storing portion 208 to check whether the duration exceeds the duration permitting time period.

The stop control portion 210 stops supplying data for generating the gradient magnetic field to the gradient magnetic field coil driving apparatus 17 when it is determined that the duration exceeds the duration permitting time period at the duration time checking portion 209. In stopping to supply the data, when the gradient magnetic field which is being applied is abruptly nullified, a large value of dB/dt is generated. Therefore, the stop control portion 210 stops the gradient magnetic field by slowly reducing the gradient magnetic field from a value currently applied.

According to the above-described constitution, dB/dt's with regard to a plurality of predetermined positions in the magnetostatic field formed by the magnetostatic field magnet 11 are calculated, and the applied magnetic field can be checked based thereon. Particularly, according to the embodiment, the maximum value of dB/dt's calculated from the plurality of positions is used and therefore, in comparison with the first embodiment, the applied magnetic field can be checked more safely.

Further, the present invention is not limited to the above-described embodiments as they are but can be specified by modifying constituent elements thereof within a range not deviated from gist thereof in an embodying stage. For example, although the operating portion 203, the component calculating portion 204, the square calculating portion 205, the root calculating portion 206, the duration calculating portion 207, the duration checking portion 209, and the stop control portion 210 are described respectively as hardwares, a portion or a total thereof may be constituted by softwares. Further, although an explanation has been given such that the applied magnetic field checking portion 20 is separate from the operating apparatus 21, the applied magnetic field checking portion 20 may execute the function in the operating apparatus 21. Further, various aspects of the invention can be formed by pertinently combining a plurality of constituent elements disclosed in the embodiments. For example, a number of constituent elements may be deleted from all the constituent elements shown in the embodiments. Further, constituent elements over the different embodiments may pertinently be combined.

What is claimed is:

1. A magnetic resonance imaging apparatus, comprising:
   a gradient magnetic field generation unit configured to generate a gradient magnetic field in a predetermined space;
   a storage unit configured to store first information about a relationship between amounts of changes of the gradient magnetic field and rates of changes of the gradient magnetic field, and second information about a relationship between the rates of changes of the gradient magnetic field and permitted time periods;
   a control data generation unit configured to generate control data to control the gradient magnetic field;
   a first calculation unit configured to calculate rate of change of the gradient magnetic field with regard to an isocenter based on the first information and amount of change of the gradient magnetic field to be applied in accordance with the control data;
   a second calculation unit configured to calculate a permitted time period of rate of change based on the second information and the calculated rate of the change of the gradient magnetic field and;
   a third calculation unit configured to calculate a duration time period of the rate of the change of the gradient magnetic field based on the control data; and
   a determination unit configured to determine whether the calculated duration time period is within the permitted time period.

2. The magnetic resonance imaging apparatus according to claim 1, further comprising:
   a stop control unit configured to control the gradient magnetic field generation unit such that the gradient magnetic field is continued to be generate in accordance with the control data when the determination unit determines that the duration time period is within the permitted time period and such that the gradient magnetic field is stopped to be generated when the determination unit determines that the duration time period is not within the permitted time period.

3. The magnetic resonance imaging apparatus according to claim 2, wherein the gradient magnetic field is stopped to be generated such that the rate of change in the gradient magnetic field is gradually reduced.

4. The magnetic resonance imaging apparatus according to claim 1, further comprising:
   a display unit configured to display a result of the determination by the determination unit.

5. The magnetic resonance imaging apparatus according to claim 1, wherein the third calculation unit calculates the duration time period by regarding that the gradient magnetic field continues generating when the gradient magnetic field in accordance with the sequence determined by the control data is stopped within a predetermined time period of a threshold.

6. The magnetic resonance imaging apparatus according to claim 5, wherein the predetermined time period of the threshold can arbitrarily be changed.

7. The magnetic resonance imaging apparatus according to claim 6, wherein the predetermined time period of the threshold can be changed to an arbitrary value.

8. The magnetic resonance imaging apparatus according to claim 1, wherein the determination unit executes the determination by regarding that the rate of the change of a maximum one of the gradient magnetic field in the time period continues when the rate of change in the gradient magnetic field in one duration is changed.

9. A magnetic resonance imaging apparatus comprising:
   a gradient magnetic field generation unit configured to generate a gradient magnetic field in a predetermined space;
   means for obtaining a duration time period of a rate of a change of the gradient magnetic field with regard to an isocenter; and
   means for determining whether the duration time period is within a permitted time period.

10. A method of controlling a magnetic resonance imaging apparatus for obtaining an image, comprising:
    generating a gradient magnetic field in a predetermined space;
    obtaining a duration time period of a rate of a change of the gradient magnetic field time with regard to an isocenter; and
    determining whether the duration time period is within a permitted time period prior to obtaining the image.

11. The method of controlling a magnetic resonance imaging apparatus according to claim 10, further comprising:
    controlling a gradient magnetic field such that the gradient magnetic field is continued to be generated when the duration time period is within the permitted time period and such that the gradient magnetic field is stopped to be generated when the duration time period is not within the permitted time period.

12. The method of controlling a magnetic resonance imaging apparatus according to claim 11, wherein the controlling the magnetic field includes stopping the gradient magnetic field such that the rate of the change of the gradient magnetic field is gradually reduced.

13. The method of controlling a magnetic resonance imaging apparatus according to claim 10, further comprising:
    displaying a result of determining whether the duration time period is within the permitted time period.

14. The method of controlling a magnetic resonance imaging apparatus according to claim 10, wherein obtaining the duration time period includes calculating the duration time period by regarding that the gradient magnetic field continues to be generated when the gradient magnetic field is stopped within a predetermined time period of a threshold.

15. The method of controlling a magnetic resonance imaging apparatus according to claim 14, further comprising:
arbitrarily setting the predetermined time period of the threshold.

16. The method of controlling a magnetic resonance imaging apparatus according to claim 14, further comprising:
changing a predetermined time period of the threshold at an arbitrary timing.

17. The method of controlling a magnetic resonance imaging apparatus according to claim 10, wherein the determining includes executing the determination by regarding that the rate of the change in a maximum one of the gradient magnetic field in the time period continues when the rate of the change in the gradient magnetic field is changed in one duration.

18. A magnetic resonance imaging apparatus, comprising:
a gradient magnetic field generation unit configured to generate a gradient magnetic field in a predetermined space;
a storage unit configured to store first information about a relationship between amounts of changes of the gradient magnetic field and rates of changes of the gradient magnetic field, and second information about a relationship between the rates of changes of the gradient magnetic field and permitted time periods;
a control data generation unit configured to generate control data to control the gradient magnetic field;
a first calculation unit configured to calculate rate of change of the gradient magnetic field with regard to the plurality of positions present at the surface or at the inner portion of the cylindrical region, based on the first information and amount of change of the gradient magnetic field to be applied in accordance with the control data;
a second calculation unit configured to calculate a permitted time period of rate of change based on the second information and the calculated rate of the change of the gradient magnetic field and;
a third calculation unit configured to calculate a duration time period of the rate of the change of the gradient magnetic field based on the control data; and
a determination unit configured to determine whether the calculated duration time period is within the permitted time period.

19. The magnetic resonance imaging apparatus according to claim 18, further comprising:
a stop control unit configured to control the gradient magnetic field generation unit such that the gradient magnetic field is continued to be generated in accordance with the control data when the determination unit determines that the duration time period is within the permitted time period and such that the gradient magnetic field is stopped to be generated when the determination unit determines that the duration time period is not within the permitted time period.

20. The magnetic resonance imaging apparatus according to claim 19, wherein the gradient magnetic field is stopped to be generated such that the rate of change in the gradient magnetic field is gradually reduced.

21. The magnetic resonance imaging apparatus according to claim 18, further comprising:
a display unit configured to display a result of the determination by the determination unit.

22. The magnetic resonance imaging apparatus according to claim 18, wherein the third calculation unit calculates the duration time period by regarding that the gradient magnetic field continues generating when the gradient magnetic field in accordance with the sequence determined by the control data is stopped within a predetermined time period of a threshold.

23. The magnetic resonance imaging apparatus according to claim 22, wherein the predetermined time period of the threshold can arbitrarily be changed.

24. The magnetic resonance imaging apparatus according to claim 23, wherein the predetermined time period of the threshold can be changed to an arbitrary value.

25. The magnetic resonance imaging apparatus according to claim 18, wherein the determination unit executes the determination by regarding that the rate of the change of a maximum one of the gradient magnetic field in the time period continues when the rate of change in the gradient magnetic field in one duration is changed.

26. A magnetic resonance imaging apparatus comprising:
a gradient magnetic field generation unit configured to generate a gradient magnetic field in a predetermined space;
means for obtaining a duration time period of a rate of a change of the gradient magnetic field with regard to the plurality of positions present at the surface or at the inner portion of the cylindrical region; and
means for determining whether the duration time period is within a permitted time period.

27. A method of controlling a magnetic resonance imaging apparatus for obtaining an image, comprising:
generating a gradient magnetic field in a predetermined space;
obtaining a duration time period of a rate of a change of the gradient magnetic field time with regard to the plurality of positions present at the surface or at the inner portion of the cylindrical region; and
determining whether the duration time period is within a permitted time period prior to obtaining the image.

* * * * *